(12) United States Patent
Chevallier et al.

(10) Patent No.: US 10,971,224 B2
(45) Date of Patent: *Apr. 6, 2021

(54) HIGH VOLTAGE SWITCHING CIRCUITRY FOR A CROSS-POINT ARRAY

(71) Applicant: Unity Semiconductor Corporation, Sunnyvale, CA (US)

(72) Inventors: Christophe Chevallier, Palo Alto, CA (US); Chang Hua Siau, Saratoga, CA (US)

(73) Assignee: Unity Semiconductor Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/886,330

(22) Filed: May 28, 2020

(65) Prior Publication Data

US 2020/0365205 A1 Nov. 19, 2020

Related U.S. Application Data

(63) Continuation of application No. 16/460,708, filed on Jul. 2, 2019, now Pat. No. 10,672,467, which is a (Continued)

(51) Int. Cl.
| | |
|---|---|
| *G11C 11/00* | (2006.01) |
| *G11C 13/00* | (2006.01) |
| *G11C 8/08* | (2006.01) |
| *G11C 8/10* | (2006.01) |
| *H03K 3/356* | (2006.01) |
| *H03K 19/0185* | (2006.01) |

(52) U.S. Cl.
CPC .......... *G11C 13/0023* (2013.01); *G11C 8/08* (2013.01); *G11C 8/10* (2013.01); *G11C 13/0007* (2013.01); *G11C 13/0028* (2013.01); *H03K 3/356104* (2013.01); *H03K 19/018521* (2013.01); *G11C 2213/31* (2013.01); *G11C 2213/71* (2013.01); *G11C 2213/77* (2013.01)

(58) Field of Classification Search
CPC .............. G11C 13/004; G11C 13/0007; G11C 2213/77; G11C 2013/0054; G11C 13/0069; G11C 7/22; G11C 13/0061; G11C 13/0011; G11C 11/5685; G11C 2211/5634; G11C 13/0021; G11C 13/003; G11C 7/04
See application file for complete search history.

(56) References Cited

U.S. PATENT DOCUMENTS

| | | |
|---|---|---|
| 8,351,264 B2 | 1/2013 | Chevallier et al. |
| 9,047,928 B2 | 6/2015 | Chevallier et al. |

(Continued)

*Primary Examiner* — Hien N Nguyen
(74) *Attorney, Agent, or Firm* — Lowenstein Sandler LLP

(57) ABSTRACT

A system includes a cross-point memory array and a decoder circuit coupled to the cross-point memory array. The decoder circuit includes a predecoder having predecode logic to generate a control signal and a level shifter circuit to generate a voltage signal. The decoder circuit further includes a post-decoder coupled to the predecoder, the post-decoder including a first stage and a second stage coupled to the first stage, the control signal to control the first stage and the second stage to route the voltage signal through the first stage and the second stage to a selected conductive array line of a plurality of conductive array lines coupled to a memory array.

20 Claims, 10 Drawing Sheets

Related U.S. Application Data continuation of application No. 16/004,705, filed on Jun. 11, 2018, now Pat. No. 10,347,332, which is a continuation of application No. 15/652,148, filed on Jul. 17, 2017, now Pat. No. 9,997,241, which is a continuation of application No. 15/090,216, filed on Apr. 4, 2016, now Pat. No. 9,711,212, which is a continuation of application No. 14/688,060, filed on Apr. 16, 2015, now Pat. No. 9,306,549, which is a continuation of application No. 14/312,022, filed on Jun. 23, 2014, now Pat. No. 9,047,928, which is a continuation of application No. 13/693,214, filed on Dec. 4, 2012, now Pat. No. 8,854,888, which is a continuation of application No. 12/653,899, filed on Dec. 18, 2009, now Pat. No. 8,351,264.

(60) Provisional application No. 61/203,229, filed on Dec. 19, 2008.

(56) References Cited

U.S. PATENT DOCUMENTS

| | | |
|---|---|---|
| 9,711,212 B2 * | 7/2017 | Chevallier ............... G11C 8/08 |
| 9,997,241 B2 | 6/2018 | Chevallier et al. |
| 2007/0279999 A1 | 12/2007 | Watanabe et al. |
| 2009/0080234 A1 | 3/2009 | Takahashi |
| 2010/0073990 A1 | 3/2010 | Siau et al. |
| 2010/0157647 A1 | 6/2010 | Rinerson et al. |

* cited by examiner

HIGH VOLTAGE SWITCHING CIRCUITRY FOR A CROSS-POINT ARRAY

PRIORITY

This application is a continuation of U.S. patent application Ser. No. 16/460,708, filed Jul. 2, 2019, and issued as U.S. Pat. No. 10,672,467, on Jun. 2, 2020, which is a continuation of U.S. patent application Ser. No. 16/004,705, filed Jun. 11, 2018, and issued as U.S. Pat. No. 10,347,332, on Jul. 9, 2019, which is a continuation of U.S. patent application Ser. No. 15/652,148, filed Jul. 17, 2017, and issued as U.S. Pat. No. 9,997,241 on Jun. 12, 2018, which is a continuation of U.S. patent application Ser. No. 15/090,216, filed Apr. 4, 2016, and issued as U.S. Pat. No. 9,711,212, on Jul. 18, 2017, which is a continuation of U.S. patent application Ser. No. 14/688,060, filed Apr. 16, 2015, and issued as U.S. Pat. No. 9,306,549 on Apr. 5, 2016, which is a continuation of U.S. patent application Ser. No. 14/312,022, filed on Jun. 23, 2014, and issued U.S. Pat. No. 9,047,928 on Jun. 2, 2015, which is a continuation of U.S. patent application Ser. No. 13/693,214, filed on Dec. 4, 2012 and issued as U.S. Pat. No. 8,854,888 on Oct. 7, 2014, which is a continuation of U.S. patent application Ser. No. 12/653,899, filed on Dec. 18, 2009 and issued as U.S. Pat. No. 8,351,264 on Jan. 8, 2013, which claims benefit of U.S. Provisional Application No. 61/203,229, filed on Dec. 19, 2008, each of which is incorporated by reference herein in its entirety.

FIELD OF THE INVENTION

The invention relates generally to data storage technology. More specifically, the invention relates to circuitry associated with non-volatile re-writeable memory.

BACKGROUND

Traditional memory support circuits are used to write and read data from arrayed memory cells. Examples of memory support circuits include sense amplifiers, row decoders, column decoders, pass gates, and the like. Decoder circuits, such as row decoders, can further include row selection circuits and drivers. Semiconductor memories typically require a certain amount of planar area to form memory support circuits, the planar area usually being determined by the quantities and types of devices (as well as device configurations) that are used to form the support circuitry. Further, complementary metal-oxide-semiconductor ("CMOS") fabrication technologies are commonly used to form the devices of the memory support circuits, the CMOS-based devices requiring planar area for both n-channel and p-channel semiconductor structures.

Certain approaches to semiconductor memory technologies provide for decoders that typically select blocks of memory, such as 512 kb to 1 Mb sized blocks of memory, for switching voltages onto a relatively large number of decoded array lines on a block-by-block basis as in, for example, NOR FLASH memory technologies. Further, some approaches use high-voltage circuitry to generate programming voltages, which typically consumes relatively more surface area than other circuitry. The high-voltage circuitry is usually designed to withstand higher voltages to ensure structural integrity.

There are continuing efforts to improve voltage generation for accessing non-volatile re-writable memory technologies.

BRIEF DESCRIPTION OF THE DRAWINGS

The invention and its various embodiments are more fully appreciated in connection with the following detailed description taken in conjunction with the accompanying drawings, in which.

Figure 1A:
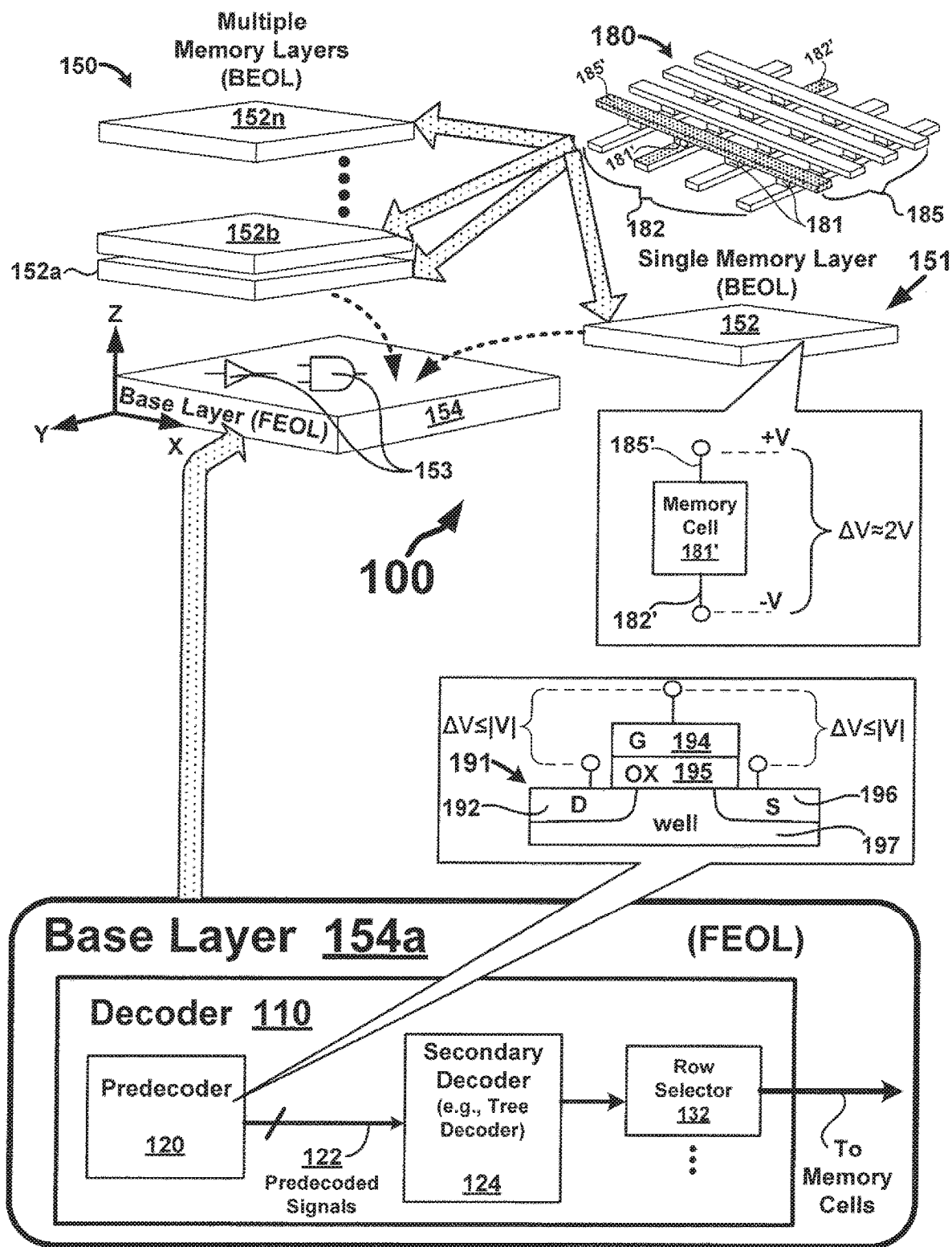
FIG. 1A depicts an integrated circuit including memory cells disposed in a single layer or in multiple layers of memory, according to various embodiments of the invention.

Although the above-described drawings depict various examples of the invention, the invention is not limited by the depicted examples. It is to be understood that, in the drawings, like reference numerals designate like structural elements. Also, it is understood that the drawings are not necessarily to scale.

DETAILED DESCRIPTION

Various embodiments or examples of the invention may be implemented in numerous ways, including as a system, a process, an apparatus, or a series of program instructions on a computer readable medium such as a computer readable storage medium or a computer network where the program instructions are sent over optical, electronic, or wireless communication links. In general, operations of disclosed processes may be performed in an arbitrary order, unless otherwise provided in the claims.

A detailed description of one or more examples is provided below along with accompanying figures. The detailed description is provided in connection with such examples, but is not limited to any particular example. The scope is limited only by the claims, and numerous alternatives, modifications, and equivalents are encompassed. Numerous specific details are set forth in the following description in order to provide a thorough understanding. These details are provided as examples and the described techniques may be practiced according to the claims without some or all of the accompanying details. For clarity, technical material that is known in the technical fields related to the examples has not been described in detail to avoid unnecessarily obscuring the description.

U.S. patent application Ser. No. 11/095,026, filed Mar. 30, 2005, published as U.S. Pub. No. 2006/0171200, and entitled "Memory Using Mixed Valence Conductive Oxides," is hereby incorporated by reference in its entirety for all purposes and describes non-volatile third dimensional memory elements that may be arranged in a two-terminal, cross-point memory array. New memory structures are possible with the capability of this third dimensional memory array. In at least some embodiments, a two-terminal memory element or memory cell can be configured to change conductivity when exposed to an appropriate voltage drop across the two-terminals. The memory element can include an electrolytic tunnel barrier and a mixed valence conductive oxide. A voltage drop across the electrolytic tunnel barrier can cause an electrical field within the mixed valence conductive oxide that is strong enough to move oxygen ions out of the mixed valence conductive oxide and into the electrolytic tunnel barrier. When certain mixed valence conductive oxides (e.g., praseodymium-calcium-manganeseoxygen—PCMO perovskites and lanthanum-nickel-oxygen—LNO perovskites) change valence, their conductivity changes. Additionally, oxygen accumulation in certain electrolytic tunnel barriers (e.g., yttrium stabilized zirconia—YSZ) can also change conductivity. If a portion of the mixed valence conductive oxide near the electrolytic tunnel barrier becomes less conductive, the tunnel barrier width effectively increases. If the electrolytic tunnel barrier becomes less conductive, the tunnel barrier height effectively increases. Both mechanisms can be reversible if the excess oxygen from the electrolytic tunnel barrier flows back into the mixed valence conductive oxide. A memory can be designed to exploit tunnel barrier height modification, tunnel barrier width modification, or both.

In some embodiments, an electrolytic tunnel barrier and one or more mixed valence conductive oxide structures do not need to operate in a silicon substrate, and, therefore, can be fabricated above circuitry being used for other purposes. For example, a substrate (e.g., a silicon—Si wafer) can include active circuitry (e.g., CMOS circuitry) fabricated on the substrate as part of a front-end-of-the-line (FEOL) process. After the FEOL process is completed, one or more layers of two-terminal cross-point memory arrays are fabricated over the active circuitry on the substrate as part of a back-end-of-the-line process (BEOL). The BEOL process includes fabricating the conductive array lines and the memory cells that are positioned at cross-points of conductive array lines (e.g., row and column conductive array lines). An interconnect structure (e.g., vias, thrus, plugs, damascene structures, and the like) may be used to electrically couple the active circuitry with the one or more layers of cross-point arrays. Further, a two-terminal memory element can be arranged as a cross-point such that one terminal is electrically coupled with an X-direction line (or an "X-line") and the other terminal is electrically coupled with a Y-direction line (or a "Y-line"). A third dimensional memory can include multiple memory elements vertically stacked upon one another, sometimes sharing X-direction and Y-direction lines in a layer of memory, and sometimes having isolated lines. When a first write voltage, VW1, is applied across the memory element (e.g., by applying ½ VW1 to the X-direction line and ½–VW1 to the Y-direction line), the memory element can switch to a low resistive state. When a second write voltage, VW2, is applied across the memory element (e.g., by applying ½ VW2 to the X-direction line and ½–VW2 to the Y-direction line), the memory element can switch to a high resistive state. Multiple memory elements can be programmed in parallel on a "word line." If the Y-direction line were the word line, ½–VW2 would be applied to a Y-direction line and ½ VW2 would be applied to multiple X-direction lines (but only those X-direction lines connected to memory elements that are to be programmed). Memory elements using electrolytic tunnel barriers and mixed valence conductive oxides can have VW1 opposite in polarity from VW2.

As used herein, a memory cell refers, at least in one embodiment, to a memory element (or a portion thereof) that is configured to store at least one data bit (or multiple multi-level states). In one embodiment, the memory cell can include a non-ohmic device (NOD) that is electrically in series with the memory element. In one embodiment, a memory device can include non-volatile memory cells, each of which includes a two-terminal memory element operative to change conductivity profiles as a function of a write voltage applied across a first terminal and a second terminal. The conductivity profile is indicative of a value of data stored in the memory cell. In some cases, the memory element can be formed with an electrolytic tunnel barrier and a mixed valence conductive oxide.

FIG. 1A illustrates an integrated circuit including memory cells disposed in a single layer or in multiple layers of memory, according to various embodiments of the invention. In this example, integrated circuit 100 is shown to include either multiple layers 150 of memory (e.g., layers 152a, 152b, . . . 152n) or a single memory layer 151 (e.g., layer 152) formed on a base layer 154. The integrated circuit 100 is a cost-effective solution to other designs that subject discrete devices to the entire range of voltages (VW1 and VW2) that are required to switch a memory element (e.g., see U.S. Pat. No. 6,798,685, and entitled "Multi-output Multiplexor," which is hereby incorporated by reference in its entirety for all purposes, for an example of such a design). If all discrete devices on the base layer 154 can operate within a smaller voltage range, then smaller discrete devices can be used. Smaller discrete devices mean a smaller base layer 154, which can result in cost savings (e.g., a reduced die size).

In at least some embodiments, each layer (e.g., layer 152 or layers 152a, 152b, 152n) of memory can be a cross point memory array 180 including conductive array lines 182 and 185 arranged in different directions to access re-writable memory cells 181 such as two-terminal memory cells. Examples of conductive array lines include X-lines conductive array lines (e.g., 182) and Y-lines conductive array lines (e.g., 185). Base layer 154 can include a bulk semiconductor substrate upon which memory access circuits 153 as well as other circuitry can be formed. In at least some embodiments, base layer 154 can be structured as base layer 154a in which a logic layer is formed on a substrate (not shown). The logic layer can be a layer that includes circuitry (e.g., 153) that can be configured to perform a variety of functions, including functions for any accessing memory layer 152 to write or read data. For example, a decoder circuit 110 can be formed in the logic layer of the base layer 154 to include a predecoder 120, a secondary decoder 124, and row selectors 132. Predecoder 120 can be configured to generate predecoded signals that are communicated via path 122 to secondary decoder 124, or to any number of secondary decoders 124 (not shown). Thus, predecoder 120 can be configured to decode a portion of an address (e.g., a group of address bits) and to generate a predecoded signal that represents an intermediary decoded value that can be used by secondary decoder 124 to determine, for example, an X-line that is to be selected (e.g., 182') to access a corresponding memory cell (e.g., selected memory cell 181') or multiple X-lines if multiple memory cells on a Y-line (e.g., 185') are to be selected. Secondary decoder 124 can be configured to use the intermediary decoded value to select the X-line(s) for accessing a row of memory cells. Row selector 132 can be configured to select one of a group of rows that are determined by secondary decoder 124 to access a specific memory cell. In at least some embodiments, row selector 132 can be optional. Similarly, the above described circuitry can be used to select a Y-line (e.g., 185') to access a corresponding selected memory cell (e.g., 181') or memory cells. Although memory cells are denoted by reference numeral 181, hereinafter, a memory cell selected for a data operation will be denoted as a selected memory cell 181' or memory cell 181' because a voltage operative to perform a data operation on the selected memory cell 181' is applied across the terminals of that memory cell.

In some embodiments, decoder 110 and/or any of its constituent elements can be composed of devices configured to operate within a voltage range that is compatible with the devices. For example, the devices each can be a metal-oxide semiconductor ("MOS") transistor 191 that include a gate terminal ("G") 194, a drain terminal ("D") 192, a source terminal ("S") 196, and a well 197 in which metal-oxide semiconductor transistor 191 can be disposed. In some embodiments, well 197 can be the bulk substrate. Metal-oxide semiconductor transistor 191 further includes an oxide structure ("OX") 195, a junction between the source 196 and the well 197, and a junction between the drain 192 and the well 197, all of which determine the voltage range that is compatible with the devices, above which the structure or functionality of the device may be affected. For example, the MOS transistors on a substrate might be able to withstand a range of three volts (e.g., from 0 v to +3 v, or from –3 v to 0 v). Further, a selected memory cell 181' of memory layers 152 can be formed between selected conductive array lines 182' and 185', across which another voltage range can be applied to perform write and read operations (e.g., data operations), including programming and erasing datum or data stored in memory cell 181'. In some embodiments, the other voltage ranges required for data operations on the memory cells include magnitudes that extend beyond the voltage range useable for metal-oxide semiconductor transistor 191. For example, the other voltage range might include a programming voltage of +6 v across the memory cell and an erase voltage of –6 v across the memory cell. In other words, unless high voltage circuitry was used on the substrate, a single discrete device would not be capable of delivering to the conductive array lines the entire voltage necessary for data operations.

In view of the foregoing, the structures and/or structures of integrated circuit 100 can implement a fabrication process to form decoder 110 as well as its constituent elements, including predecoder 120, secondary decoder 124 and row selector 132. Thus, base layer 154a, as well as decoder 110 and its constituent elements, can be fabricated with equivalent devices, rather than implementing circuitry (e.g., high voltage circuitry) having structures that are configured to operate at voltage ranges that can be higher than other devices, such as metal-oxide semiconductor transistor 191. To illustrate, consider that metal-oxide semiconductor transistor 191 operates with voltages from 0 to VCCQ in devices fabricated in CMOS processes. According to at least some embodiments, metal-oxide semiconductor transistor 191 can be used to generate at a portion of a voltage swing from +VCCQ to –VCCQ for writing to memory cell 181. Also, decoder 110 or its constituent elements can facilitate selective switching to access fewer X-lines or Y-lines (e.g., a single X-line and a single Y-line) than otherwise might be the case when X-lines and Y-lines are accessed at a block-level. Further, predecoder 120 can include level shifters configured to generate either negative or positive voltages in response to logic values associated with positive voltages, such as zero volts (e.g., logical value of 0) and 1.8 or 3.0 volts (e.g., logical value of 1).

Figure 1B:
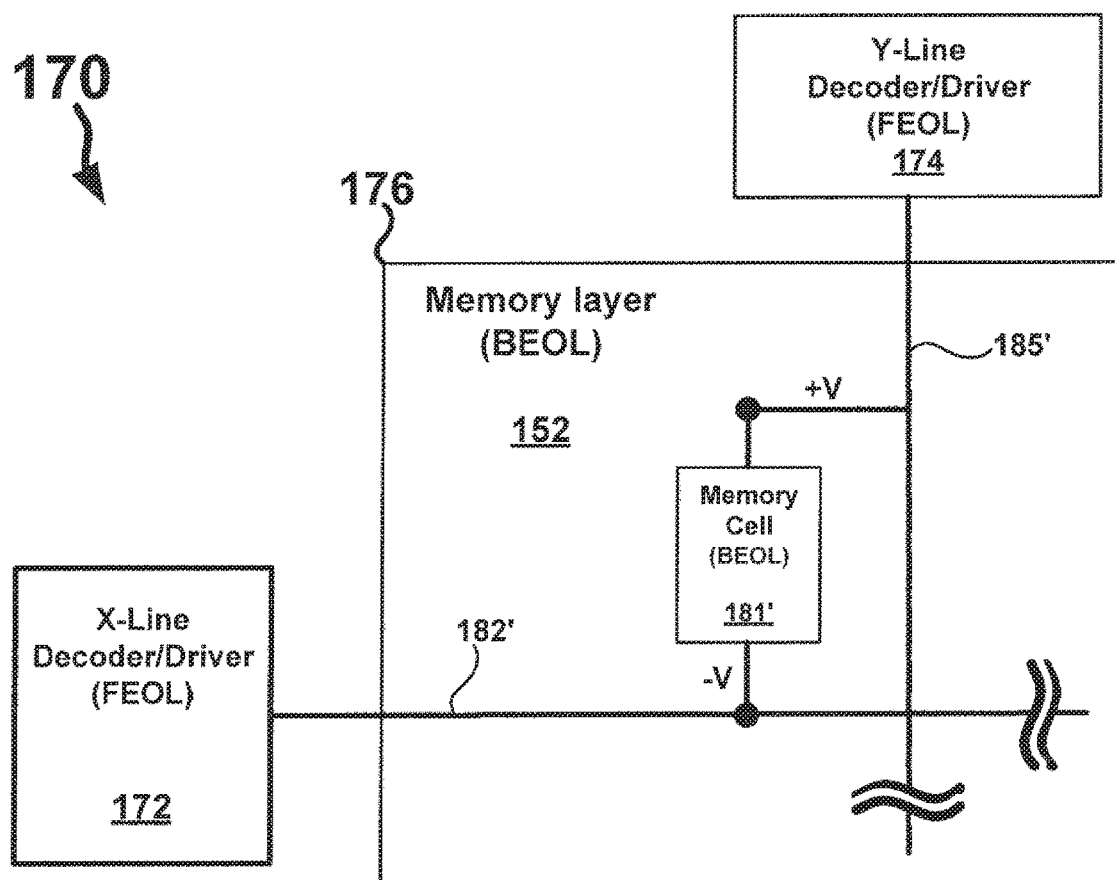
FIG. 1B depicts decoders used to access a memory cell disposed in a single layer or in multiple layers of memory, according to various embodiments of the invention.

FIG. 1B illustrates decoders used to access a selected memory cell disposed in a single layer or in multiple layers of memory, according to various embodiments of the invention. As shown, an X-line decoder 172 and a Y-line decoder 174 are configured respectively to drive voltage signals on array line 185' and array line 182' to write and read data to selected memory cell 181'. In some embodiments, X-line decoder 172 and Y-line decoder 174 are composed of devices configured to operate in ranges from 0 to +V volts or from –V to 0 volts, but are configured to collaborate to apply a voltage difference of 2V (e.g., a potential difference from V to +V) to memory cell 181'. As shown, X-line decoder 172 and Y-line decoder 174 can facilitate selective switching by accessing individual lines, such as X-line 182' and Y-line 185' rather than accessing memory cell 181' as part of accessing multiple memory cells along an entire Y-line 185'. Thus, X-line decoder 172 and Y-line decoder 174 can selectively apply portions of a voltage via respective array lines 182' and 185'.

Figure 1C:
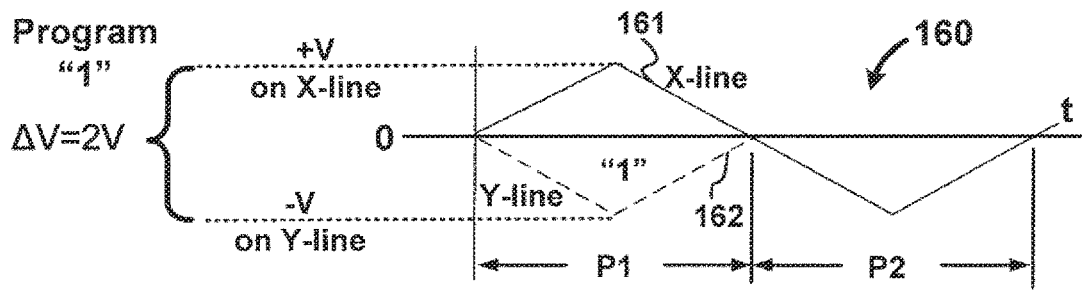
FIG. 1C depicts an example of voltage signals generated by a X-line decoder and a Y-line decoder having voltages in one range to generate voltages in another range, according to some embodiments.
Figure 1D:
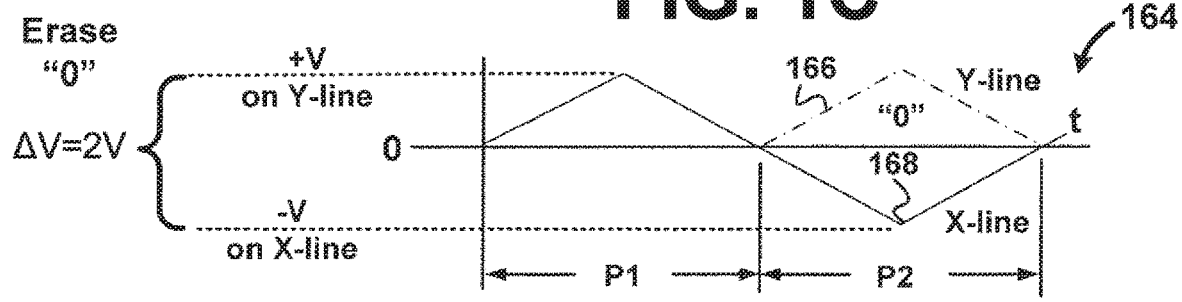
FIG. 1D illustrates another example of voltage signals generated by an X-line decoder and a Y-line decoder, the individual decoders having voltages in one range to generate combined voltages in another range, according to some embodiments.

FIG. 1C illustrates an example of voltage signals generated by a X-line decoder and a Y-line decoder, the individual voltages having voltages in one range to generate combined voltages in another range, according to some embodiments. Diagram 160 illustrates that an X-line can be driven by a signal 161 within voltage ranges from 0 to +V volts and from –V to 0 volts (e.g., AV=|V|), and that a Y-line can be driven by a signal 161 within voltage ranges from –V to 0 volts and from 0 to +V volts (e.g., AV:1V1). As shown, signal 161 and signal 162 includes a +V voltage and a –V voltage, respectively, to apply a voltage of 2V (e.g., of positive polarity) across memory cell 181'. In this example, a positive voltage on the X-line and a negative voltage on the Y-line programs memory cell 181' with, for example, a logical value of "1". FIG. 1D illustrates another example of voltage signals generated by an X-line decoder and a Y-line decoder, the individual decoders having voltages in one range to generate combined voltages in another range, according to some embodiments. Diagram 164 illustrates that an X-line can be driven by a signal 168 within voltage ranges from 0 to +V volts and from –V to 0 volts (e.g., AV=|V|), and that a Y-line can be driven by a signal 166 within voltage ranges from –V to 0 volts and from 0 to +V volts (e.g., AV=|V|). As shown, signal 168 and signal 166 includes a –V voltage and a +V voltage, respectively, to apply a voltage of 2V (e.g., of negative polarity) across memory cell 181'. In this example, a negative voltage on the X-line and a positive voltage on the Y-line erases memory cell 181' to represent, for example, a logical value of "0". In view of the foregoing, X-line decoders and Y-line decoders can be configured to have structures that are suitable to provide less than the voltage difference that is applied across memory cell 181', thereby enabling the X-line decoders and the Y-line decoders to be composed of devices equivalent to others formed in the base layer 154.

Figure 2:
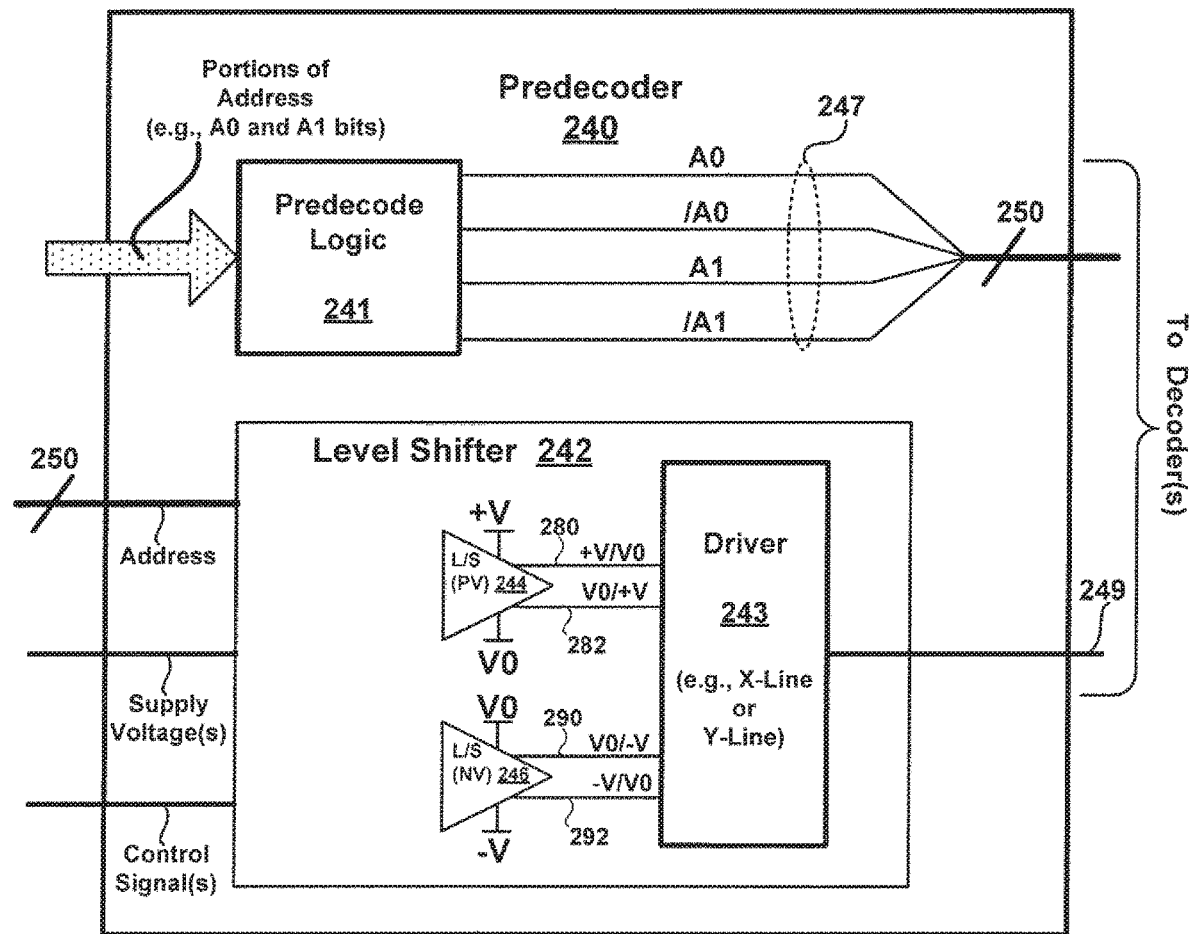
FIG. 2 depicts one example of a predecoder including predecoder logic and a level shifter circuit, according to at least some embodiments of the invention.
Figure 2A:
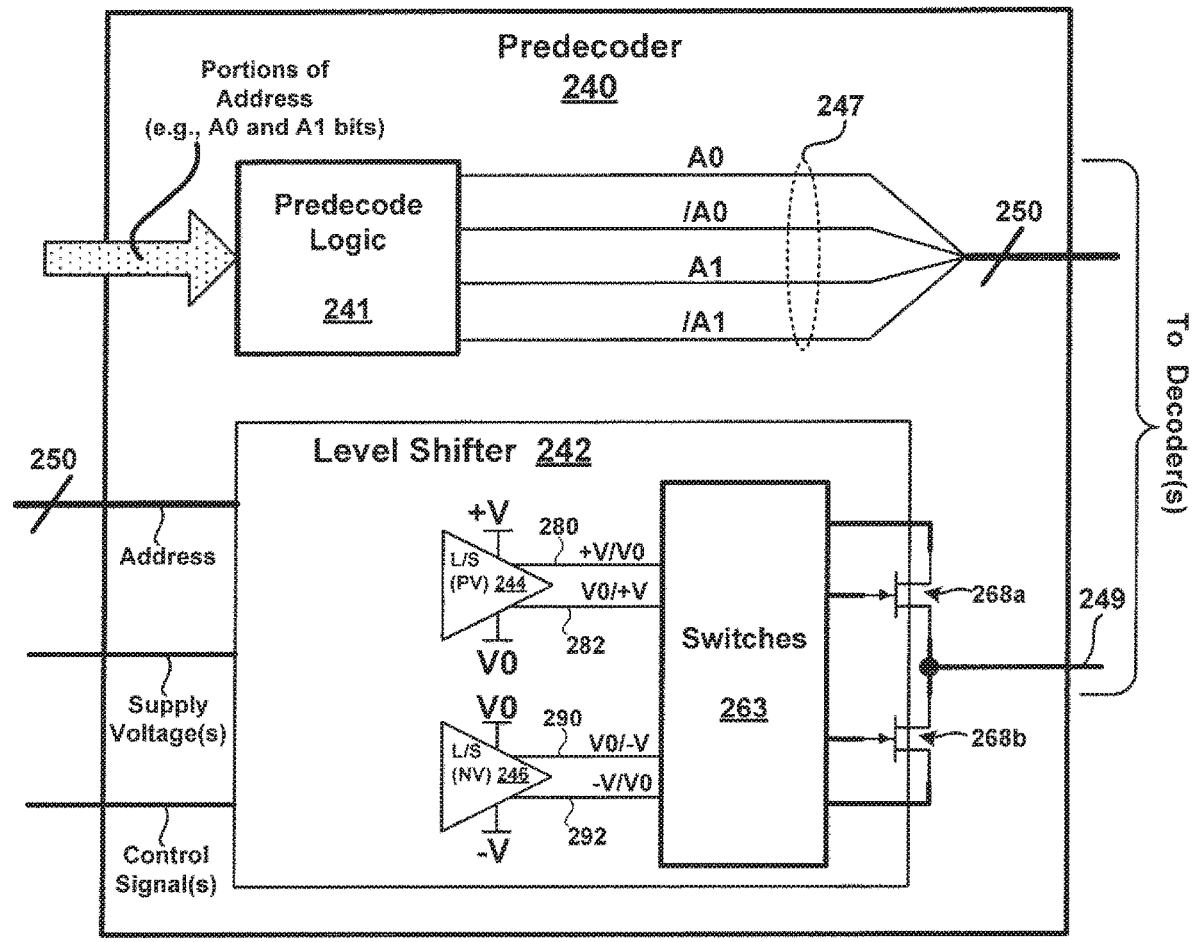
FIG. 2A depicts another example of a predecoder including predecoder logic and a level shifter circuit, according to at least some embodiments of the invention.

FIG. 2 depicts a predecoder 240 including predecode logic 241 and a level shifter circuit 242, according to at least some embodiments of the invention. Predecode logic 241 can be configured to generate predecoded signals that are communicated via one or more paths 247 that are collectively denoted as bus 250. In this example, predecode logic 241 can be configured to receive a portion of an address, such as address bits A0 and A1, and to generate a predecoded signal indicating whether A0 is either in one state (i.e., A0) or in another state (i.e., /A0, or not A0), and whether A1 is either in one state or another state (i.e., /A1, or not A1). Level shifter circuit 242 is shown in this example to include two level shifters: a level shifter ("L/S (PV)") 244 configured to shift between an intermediate value or reference value, V0, (e.g., 0 volts) and a positive voltage value, +V, (e.g., +3V), and a level shifter ("L/S (NV)") 246 configured to shift between an intermediate value or reference value, V0, (e.g., 0 volts) and a negative voltage value, −V, (e.g., −3V). Level shifter circuit 242 can also include a driver 243, which can be configured to select any of the values of the positive voltage, intermediary voltage, and the negative voltage and to generate level-shifted voltages, such as +V, 0, and −V volts. In at least some embodiments, the operation of level shifter 244 and level shifter 246 are mutually exclusive. That is, when level shifter 244 is transmitting +V volts and V0 volts via paths 280 and 282, respectively, or when level shifter 244 is transmitting V0 volts and +V volts via respective paths 280 and 282, level shifter 246 can transmit 0 volts on both path 290 and path 292. Similarly, when level shifter 246 is transmitting V0 volts and −V volts via paths 290 and 292, respectively, or when level shifter 246 is transmitting −V volts and V0 volts via respective paths 290 and 292, level shifter 244 can transmit 0 volts on both path 280 and path 282.

Further, driver 243 can include a first driver portion configured to operate during a programming operation, and a second driver portion configured to operate during an erase operation. Consider that driver 243 can be disposed in an X-line decoder. Thus, driver 243 can be configured to accept +V volts and 0 volts from level shifter 244 during programming operations. If the X-line is selected to program a memory cell, then driver 243 can provide +V volts onto output terminal 249, which, in turn, is transmitted via an X-line to a memory cell 181' (not shown). Otherwise, if the X-line is unselected during the programming of a memory cell 181, then driver 243 can provide 0 volts onto output terminal 249. Further consider that driver 243 can be disposed in a Y-line decoder. Thus, driver 243 can be configured to accept +V volts and 0 volts from level shifter 244 during erasing operations. If the Y-line is selected to erase a memory cell 181', then driver 243 can provide +V volts onto output terminal 249, which, in turn, is transmitted via a Y-line to a memory cell 181'. Otherwise, if the Y-line is unselected during the erasing of the memory cell 181, then driver 243 can provide 0 volts onto output terminal 249. Driver 243 can interact with level shifter 246 in a similar manner.

In some embodiments, one or more devices that constitute negative voltage level shifter can be composed of three-terminal devices each including a first terminal, a second terminal, and third terminal. In some other embodiments, one or more devices that constitute negative voltage level shifter can be composed of four-terminal devices in which the fourth terminal is coupled to a well and to one of the first terminal, the second terminal, or the third terminal. In some cases, the one or more devices can be formed in common or separate wells or portions of a bulk substrate. If the one or more devices are MOS devices, then the first terminal, the second terminal, the third terminal, and the fourth terminal can correspond respectively to, for example, a drain terminal, a gate terminal, a source terminal, and a well (or bulk) terminal.

Figure 3A:
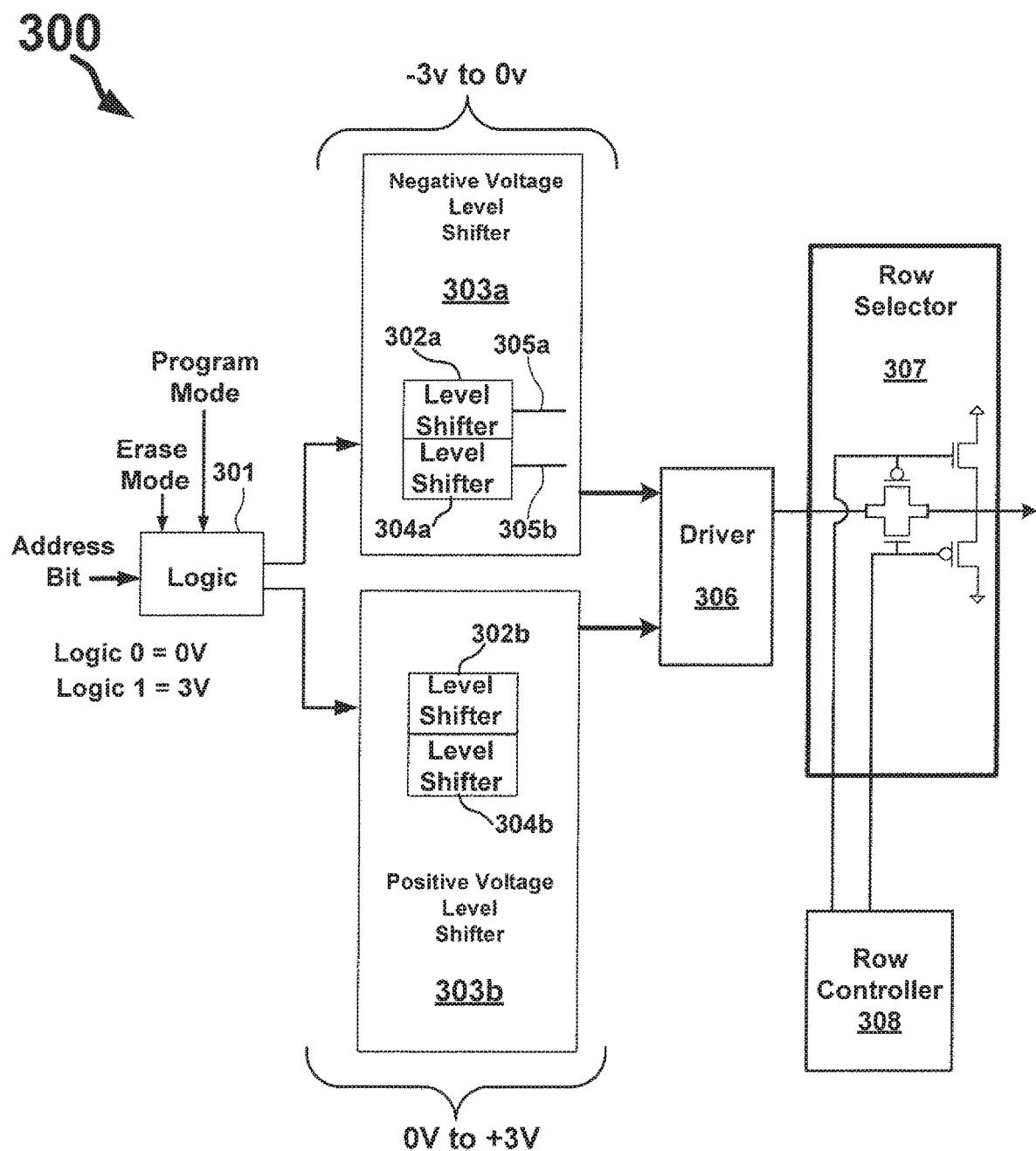
FIG. 3A depicts another example of a decoder, according to at least some embodiments of the invention.

FIG. 3A depicts another example of a decoder, according to at least some embodiments of the invention. Decoder 300 includes logic 301, a negative voltage level shifter 303a, a positive voltage level shifter 303b, a driver 306, and a row selector 307. Logic 301 includes circuitry configured to control operation of negative voltage level shifter 303a and positive voltage level shifter 303b. For example, logic 301 can be configured to receive one or more address bits to determine whether decoder 300 is associated with an array line that is used to access a memory cell 181, as well as control signals (e.g., program mode and/or erase mode signals) to determine which of negative voltage level shifter 303a and positive voltage level shifter 303b can be used to generate voltage signals as a function of the control signals. Negative voltage level shifter 303a can include a level shifter 302a and a level shifter 304a. For example, level shifter 302a can be configured to apply a negative voltage (e.g., −3V) to output terminal 305a during a first state, and can be configured to apply a reference voltage (e.g., 0V) to output terminal 305a during a second state. Level shifter 304a can be configured to apply the reference voltage to output terminal 305b during the first state, and can be configured to apply the negative voltage to output terminal 305b during the second state. Positive voltage level shifter 303b can include a level shifter 302b and a level shifter 304b to enable positive voltage level shifter 303b to operate in a manner similar to negative voltage level shifter 303a, but generates voltage levels in a positive voltage range between, for example, 0V and +3V. The selected one of negative voltage level shifter 303a and positive voltage level shifter 303b can transmit a range of voltages (e.g., between 0V and +/−3V) to driver 306, and the unselected other of negative voltage level shifter 303a and positive voltage level shifter 303b can transmit reference voltages, such as 0V, to apply to driver 306 to maintain lines in driver 306 at levels to avoid floating lines. In some embodiments, decoder 300 can include a row controller 308 that can be configured to operate an optional row selector 307, which can be coupled to one or more X-lines to selectively bias or enable them in a similar fashion to logic 301, negative level shifter 303a, positive level shifter 303b and driver 306.

Figure 3B:
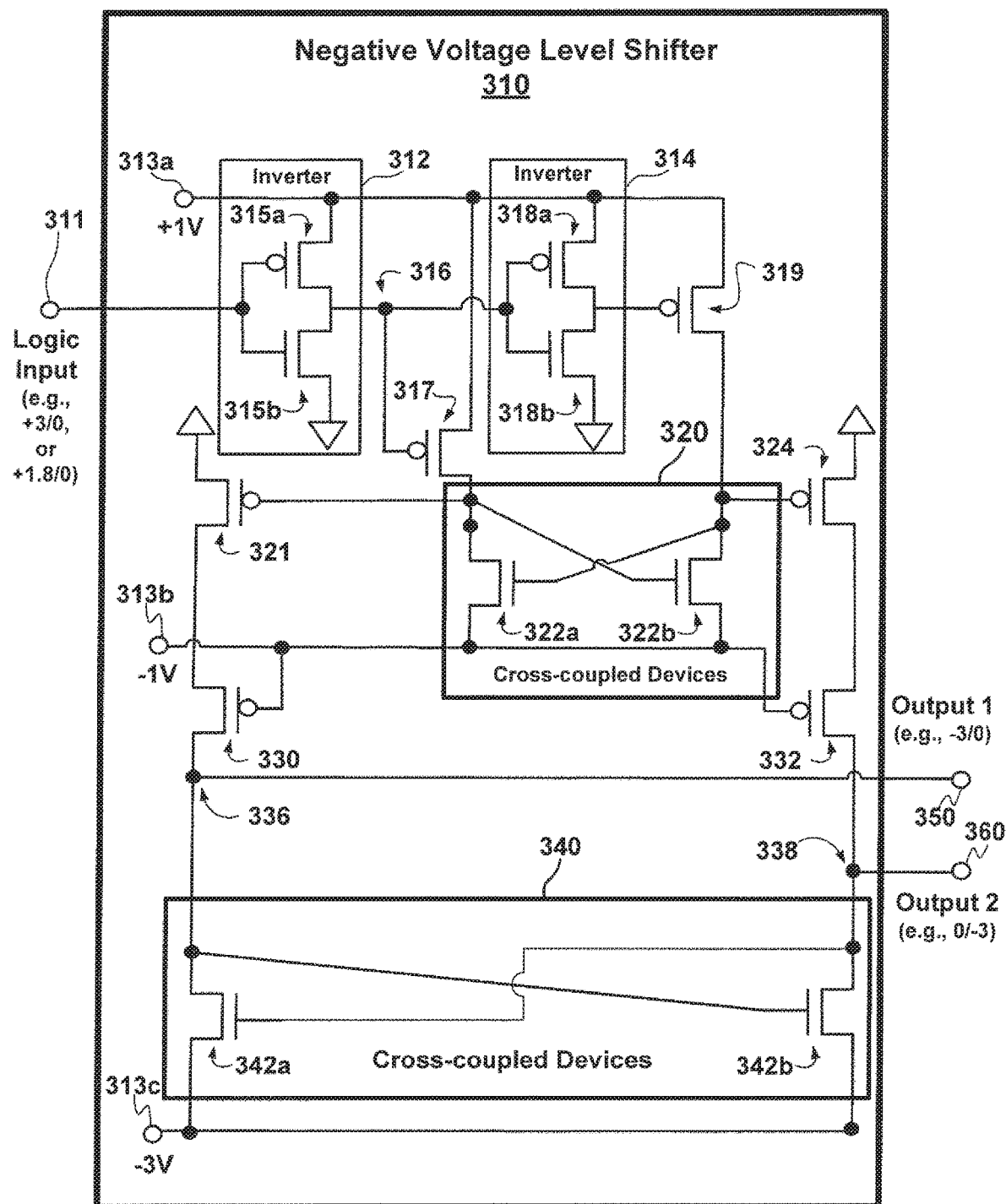
FIG. 3B depicts an example of a negative voltage level shifter, according to at least some embodiments of the invention.

FIG. 3B depicts an example of a negative voltage level shifter, according to at least some embodiments of the invention. Negative voltage level shifter 310 includes an input terminal 311, a first output terminal 350, and a second output terminal 360, as well as a source terminal 313a that is configured to supply one voltage (e.g., +1V), a source terminal 313b that is configured to supply another voltage (e.g., −1V), and a source terminal 313c that is configured to supply yet another voltage (e.g., −3V). Negative voltage level shifter 310 includes an inverter 312, which is composed of a PMOS device 315a and an NMOS device 315b, and an inverter 314, which is composed of a PMOS device 318a and an NMOS device 318b. Inverter 312 and inverter 314 are coupled respectively via PMOS device 317 and PMOS device 319 to a cross-coupled pair of devices 320, which includes an NMOS device 322a and an NMOS device 322b. Further, cross-coupled pair of devices 320 is coupled via a PMOS device 324 and a PMOS device 332, and is also coupled via a PMOS device 321 and a PMOS device 330 cross-coupled pair of devices 340. Cross-coupled pair of devices 340 includes an NMOS device 342*a* and an NMOS device 342*b*. To illustrate operation of negative voltage level shifter 310, consider that negative voltage level shifter 310 is disposed in a Y-line decoder and is in a programming mode of operation. Next, consider that a voltage (i.e., any value above source terminal 313*a*) indicative of a logical value of one is applied to input terminal 311. In response, inverter 312 is activated to provide 0V to node 316, which turns on PMOS device 317 to couple +1V from source terminal 313*a* to the gate of NMOS device 322*b*. Cross-coupled pair of devices 320, in response, turns on PMOS device 324 and PMOS device 332, thereby setting node 338 to 0V, which is also applied to output terminal 360. A voltage of zero volts at node 338 is transmitted to the gate of PMOS device 342*a*, which turns on to supply −3V to node 336. Thus, output terminal 350 can receive −3V, thereby generating a negative voltage in response to a positive voltage applied at input terminal 311. In view of the foregoing, a level shifter or a first portion of negative voltage level shifter 310 can be configured to generate a negative voltage (e.g., −3V) at output terminal 350 during a first state (e.g., during application of +3V, +1.8V, etc. to input 311), and to generate a reference voltage (e.g., 0V) at output terminal 350 during a second state (e.g., during application of 0V to input 311). Another level shifter or a second portion of negative voltage level shifter 310 can be configured to generate the reference voltage at output terminal 360 during the first state, and to generate the negative voltage at output terminal 360 during the second state. The first level shifter and second level shifter can be configured to operate substantially concurrent with each other. A positive voltage level shifter (not shown) for generating positive voltages is well known in the art.

FIGS. 4A to 4D depict examples of a driver operating in response to various states of input, according to at least some embodiments of the invention. Specifically, FIGS. 4A to 4D depict a driver as driver 401, a driver 411, a driver 421, and a driver 431, respectively, as the driver being in different modes of operation. In some embodiments, the values of the input signals applied to the input terminals, such as input terminals 402, 404, 406, and 408 of driver 401, determine the mode of operation for the driver. Driver 401 generates an output voltage at output terminal 410 as a function of the values of the input signals. Driver 401 is shown to include an input terminal 402 coupled to a gate of a PMOS device 492 and a gate of an NMOS device 490. Those skilled in the art would appreciate that the bulk of such NMOS devices are typically isolated from the substrate using well-in-well or deep n well techniques. Driver 401 also is shown to include an input terminal 404 coupled to a source and a well of PMOS device 492 and to a source and a well of a PMOS device 496. Further, driver 401 includes an input terminal 406 coupled to a source and a well of an NMOS device 494 and to a source and a well of NMOS device 490. An input terminal 408 can be coupled to a gate of NMOS device 494 and a gate of PMOS device 496. Driver 401 includes an output terminal 410 that is coupled to a drain of each of PMOS device 492, NMOS device 490, PMOS device 496, and NMOS device 494.

Figure 4A:
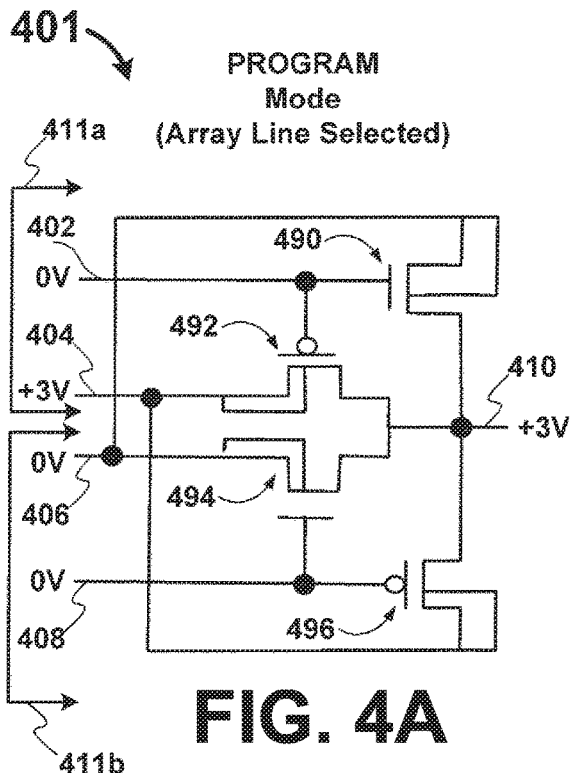
FIGS. 4A to 4D depict examples of a driver operating in response to various states of input, according to at least some embodiments of the invention.

Further, FIG. 4A shows a driver 401 including a driver portion 411*a* that is configured to cooperate with one level shifter circuit (not shown), such as a positive voltage level shifter, and a driver portion 411*b* that is configured to cooperate with another level shifter circuit (not shown), such as a negative voltage level shifter, in accordance with some embodiments. In some embodiments, driver portion 411*a* can be configured to operate during a programming operation, and driver portion 411*b* can be configured to operate during an erase operation. To illustrate, consider that input terminal 402 is coupled to path 280 (e.g., the +V/V0 output) of level shifter 244 of FIG. 2 and that input terminal 404 is coupled to path 282 (e.g., the V0/+V output). Further consider that input terminal 406 is coupled to path 290 (e.g., the V0/−V output) of level shifter 246 of FIG. 2 and that input terminal 408 is coupled to path 292 (e.g., the −VN0 output). Further consider that driver 401 is associated with an X-line decoder to drive a selected X-line, which is an array line (e.g., 182'), with a portion of the voltage (e.g., 0 to +V volts) for a second voltage range (e.g., −V to +V volts). When 0 volts and +3 volts (from the positive voltage level shifter) are applied to input terminal 402 and terminal 404, respectively, driver 401 generates +3V at output terminal 410, whereas the negative voltage level shifter is unselected. Thus, the negative voltage level shifter can transmit 0V to both input terminals 406 and 408, thereby causing driver portion 411*b* to be unselected (and does not participate in generating a negative voltage). Note that as used herein, the term "driver portion" can be referred, at least in some embodiments, to the subset of functionality of a driver that is responsive to signals originating from a voltage level shifter (e.g., either the negative voltage level shifter or the positive voltage level shifter).

Figure 4B:
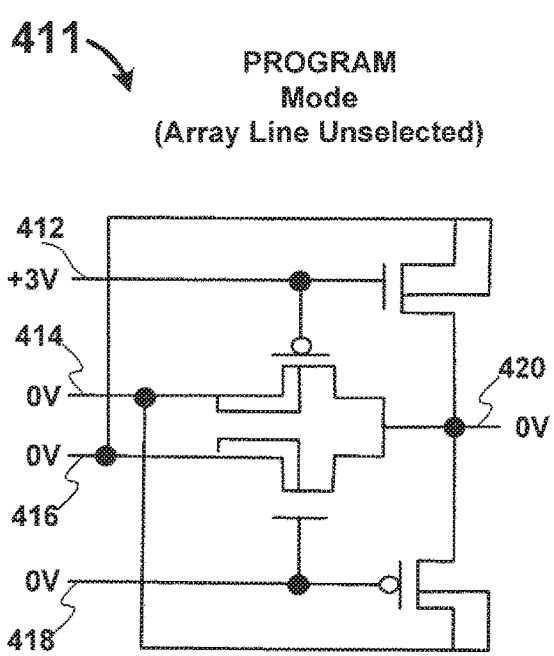

FIG. 4B shows an example of driver 411 that includes input terminals 412, 414, 416, and 418, which determine the mode of operation for driver 411. Further, driver 411 can generate an output voltage at output terminal 420 as a function of the values of the input signals. In the example shown, consider that driver 411 is disposed in association with an X-line during a programming mode. However, in this example, driver 411 is not associated with the X-line being selected. Thus, the values of +3v, 0V, 0V, and 0V on respective input terminals 412, 414, 416, and 418 generates 0V at output terminal 420. By driving the X-line with 0V, the X-line is not in a floating state.

Figure 4C:
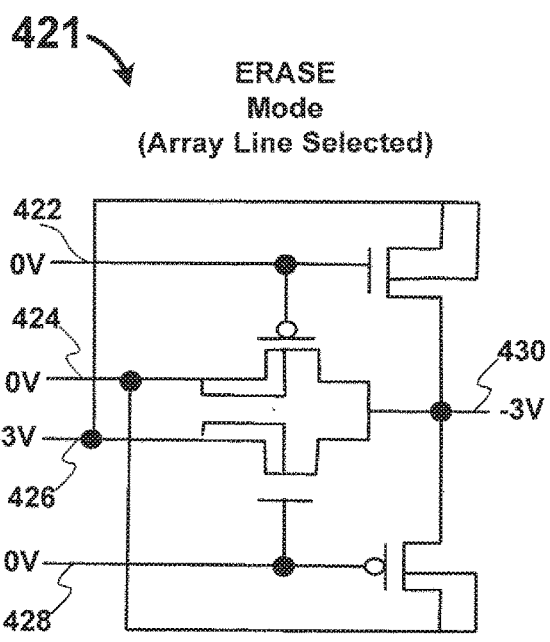

FIG. 4C shows an example of driver 421 that includes input terminals 422, 424, 426, and 428, which determine the mode of operation for driver 421. Further, driver 421 can generate an output voltage at output terminal 430 as a function of the values of the input signals. In the example shown, consider that driver 421 is disposed in association with an X-line, whereby driver 421 is used during an erase mode to erase a datum or data stored in a memory cell 181'. In this case, driver 421 can be configured to generate a portion (i.e., a negative portion) of the second range of voltages between −V and +V. Thus, the values of 0V, 0V, −3V, and 0V on respective input terminals 422, 424, 426, and 428 can cause generation of −3V at output terminal 430. As the positive voltage level shifter is unselected (during erase modes for X-lines), the positive voltage level shifter transmits values of 0V to both input terminals 422 and 424.

Figure 4D:
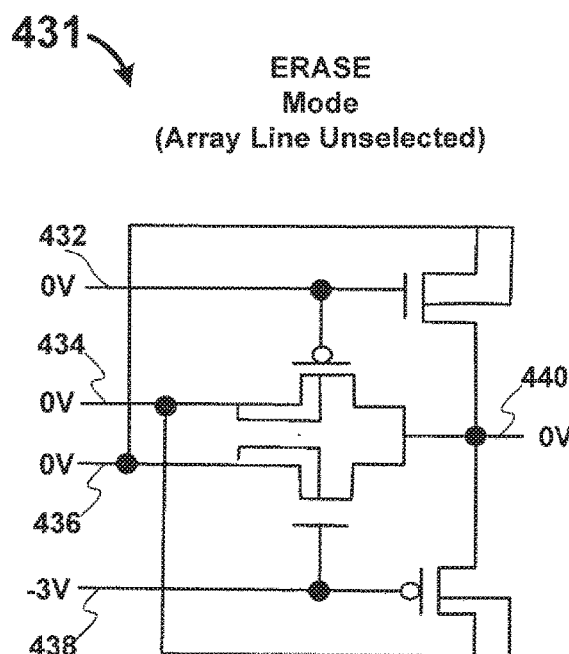

FIG. 4D shows an example of driver 431 that includes input terminals 432, 434, 436, and 438, which determine the mode of operation for driver 431. Further, driver 431 can generate an output voltage at output terminal 440 as a function of the values of the input signals. In the example shown, consider that driver is disposed in association with an X-line during an erase mode. However, in this example, driver 431 is not associated with an X-line that is selected. Thus, the values of 0V, 0V, 0V, and −3V on respective input terminals 432, 434, 436, and 438 generates 0V at output terminal 440.

In view of the foregoing, a driver can generate a first voltage associated with a programming operation (e.g., a voltage between 0 and +V), a second voltage associated with the erase operation (e.g., a voltage between −V and 0), and a third voltage associated an unselected state for the driver (e.g., 0 volts). In some embodiments, driver 401 can be configured to be composed of four-terminal devices having a first terminal, a second terminal, a third terminal, and a fourth terminal. Further, the four-terminal devices can also include a well (e.g., in which the four-terminal devices are formed) coupled to the fourth terminal and to one of the first terminal, the second terminal, or the third terminal. In some embodiments, the four-terminal devices can be MOS devices, such as PMOS and NMOS devices. Thus, the first terminal, the second terminal, the third terminal, and the fourth terminal can correspond respectively to, for example, a drain terminal, a gate terminal, a source terminal, and a well (or bulk) terminal. In some embodiments, the well terminal is coupled to the source terminal to, for example, maintain appropriate voltage differentials. Thus, the voltage differentials across pairs of the terminals of the MOS devices can be maintained within the first voltage range (e.g., between a range of −V to 0 volts or a range of 0 to +V volts) to, among other things, preserve the integrity of an oxide structure and the junctions in the MOS devices (e.g., oxide structure OX 195, junction between source 196 and well 197, and junction between drain 192 and well 197 in FIG. 1A). Therefore, in driver 401, the four-terminal devices can be configured to collaborate with one another to generate negative portions (e.g., −V to 0 volts) and positive portions (e.g., 0 to +V volts) of a voltage for a second voltage range (e.g., −V to +V volts) using voltage differences across two of any of the first terminal, the second terminal, the third terminal, and the fourth terminal in the first voltage range of either −V to 0 volts or 0 to +V volts. In some other embodiments, the source and well terminals need not be coupled.

Figure 5:
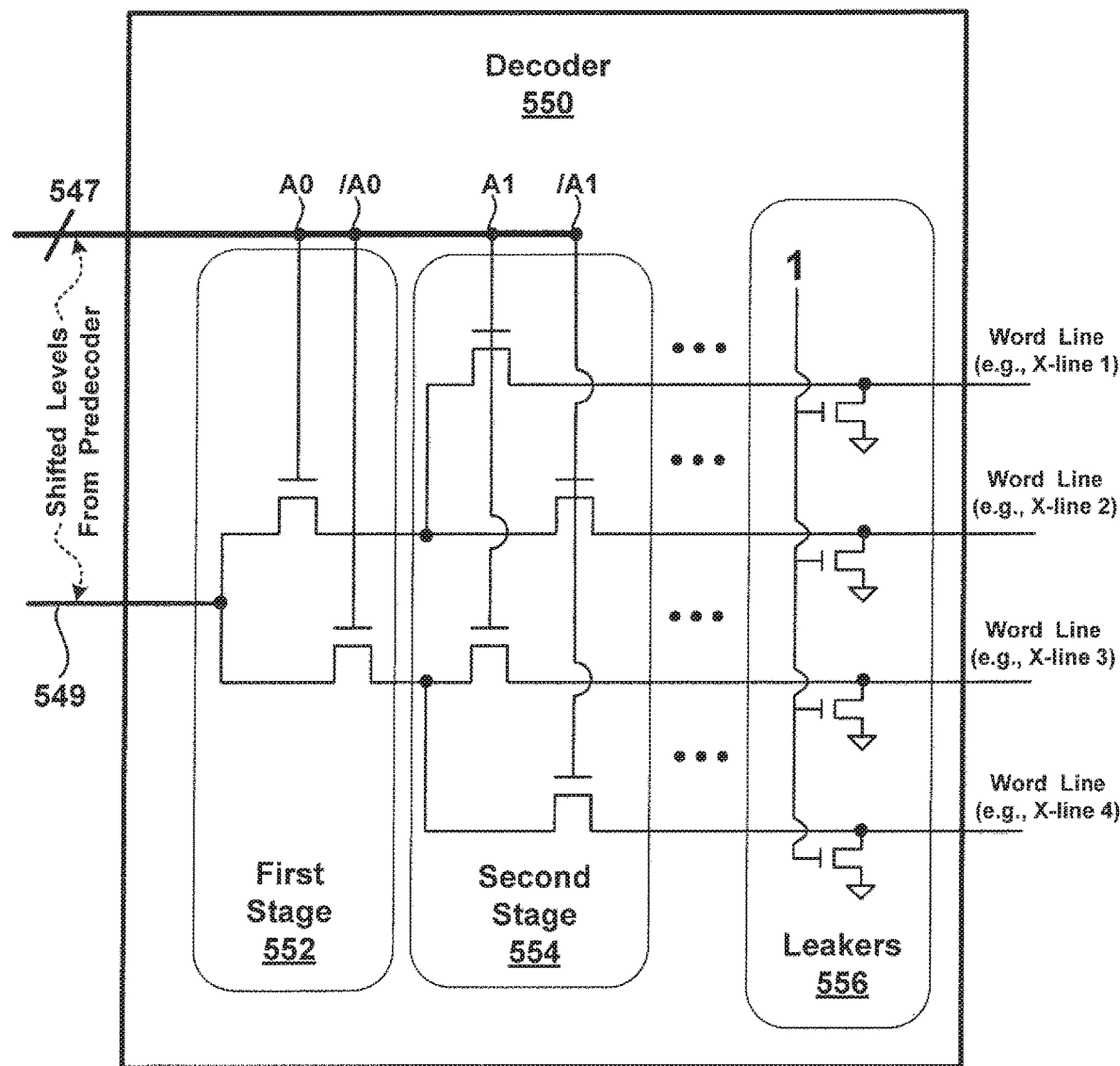
FIG. 5 depicts a decoder including a number of stages, according to at least some embodiments of the invention.

FIG. 5 depicts a secondary decoder 550 including a number of stages, according to at least some embodiments of the invention. In this example, secondary decoder 550 can be configured as a tree decoder that is composed of MOS devices, such as NMOS devices, having any number of stages. Namely, secondary decoder 550 can include a first stage 552 and a second stage 554, with other stages not shown. First stage 552 and second stage 554 can be controlled by predecoded signals on path 547. Further, a signal sent via path 549 can be propagated through the tree structure of MOS devices, as a function of the values of predecoded signals on path 547. Leakers 556 can be optional, and, if used, can ensure that the conductive array lines (e.g., 182 and 185) are not floating or in some unintended state.

Figure 6:
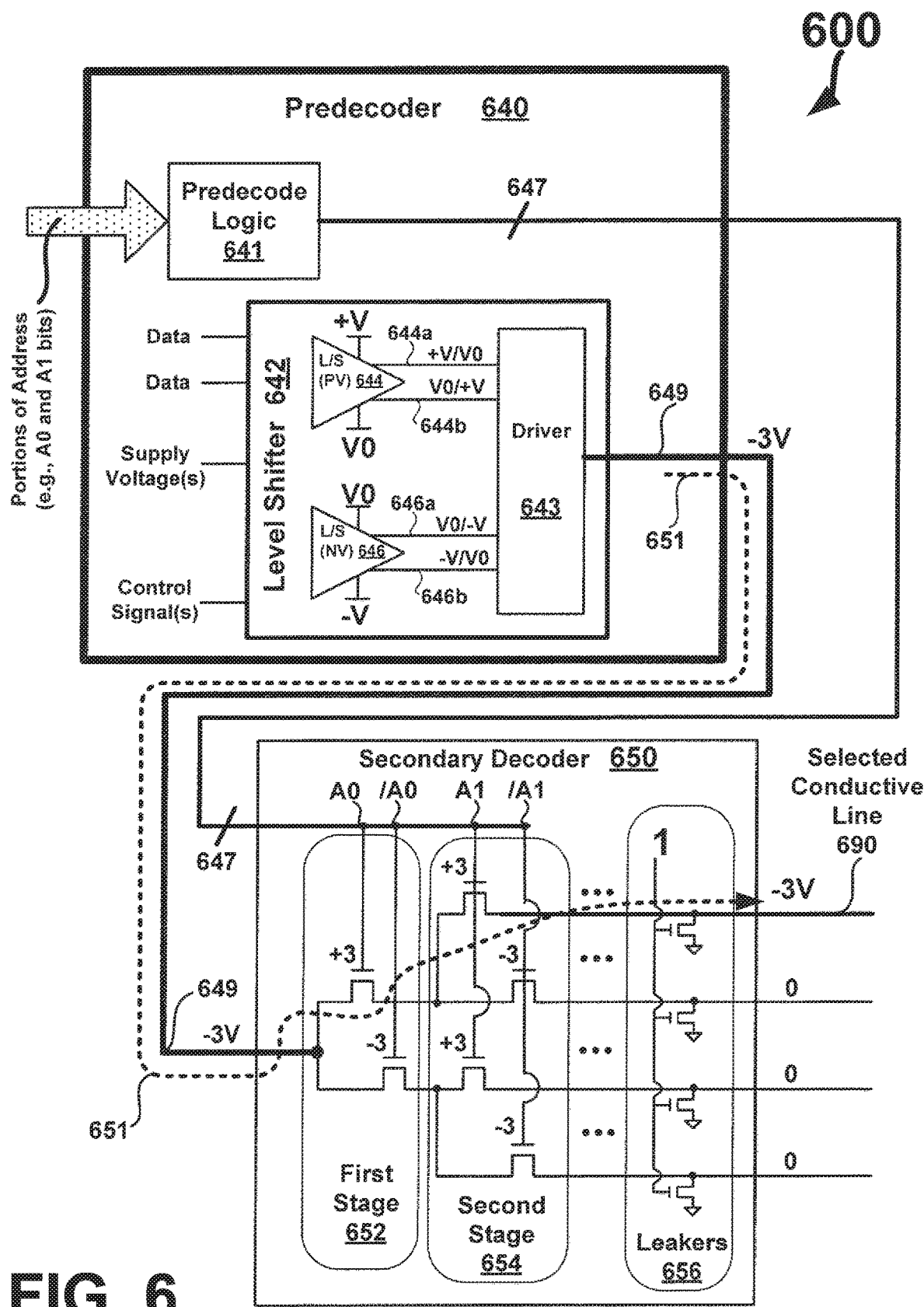
FIG. 6 depicts one example of a decoder including a predecoder and a decoder, according to at least some embodiments of the invention.
Figure 6A:
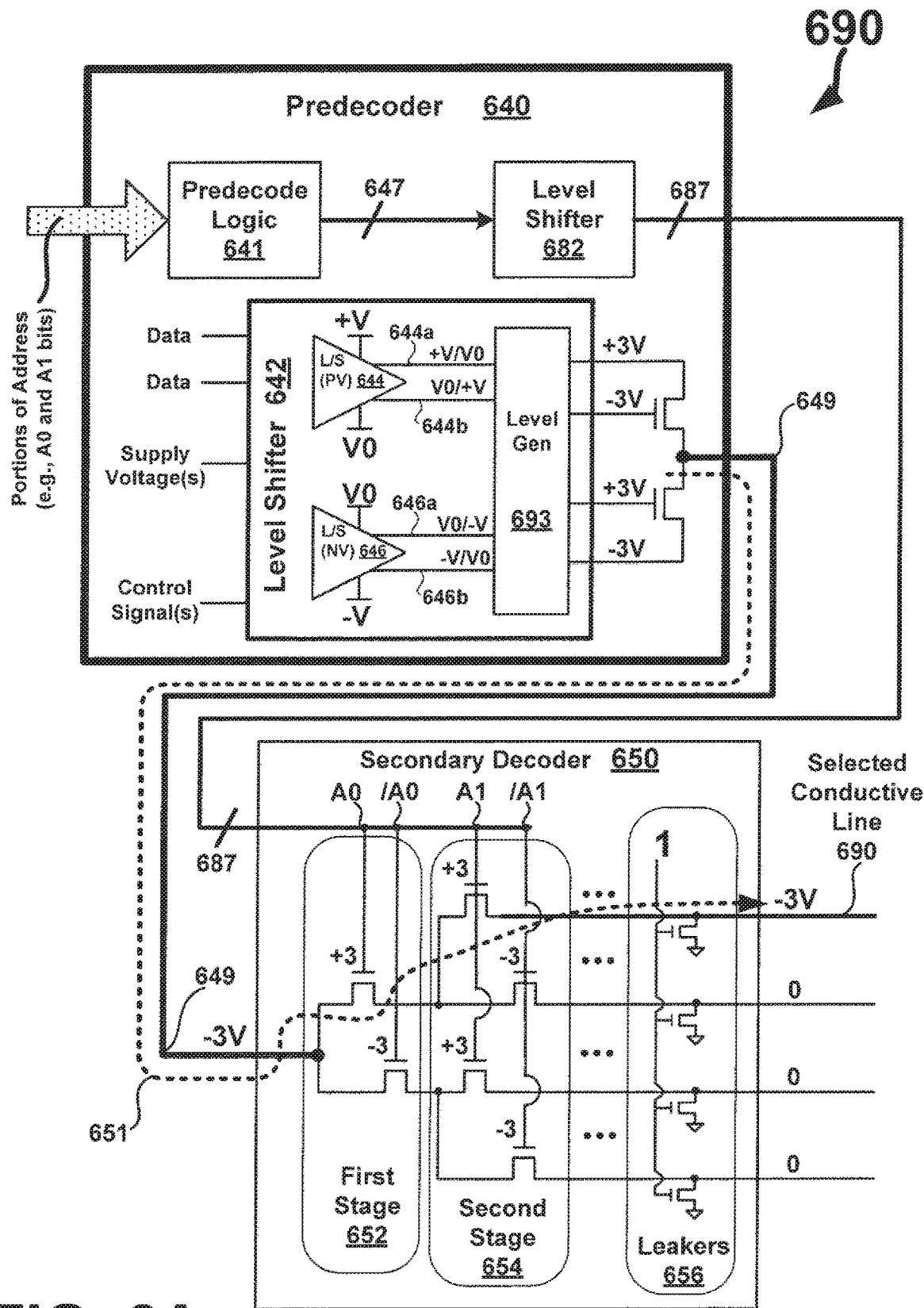
FIG. 6A depicts another example of a predecoder including predecoder logic and a level shifter circuit, according to at least some embodiments of the invention.

FIG. 6 depicts a decoder 600 including a predecoder and a secondary decoder, according to at least some embodiments of the invention. In this example, decoder 600 includes predecode logic 641 and level shifter circuit 642, which, in turn, includes level shifters 644 and 646, and driver 643. Further, decoder 600 includes secondary decoder 650, which operates as a post-decoder, and includes a first stage 652, a second stage 654, and optional leakers 656. In this example, predecoder is configured to generate a −3 volt signal at line 649, and predecode logic 641 is configured to transmit control signals to route the −3 volt signal via a path 651 to the selected conductive array line 690, which, in turn, is coupled to an array line associated with a memory cell upon which a memory operation is performed. Predecode logic 641 can include components similar to logic 301, negative level shifter 303a, positive level shifter 303b and driver 306 from FIG. 3A. To pass a 3 volt signal at selected conductive array line 690, some designs could have path 647 be at about 4 volts while other designs could build secondary decoder 650 gates in a design similar to the row selector 307 of FIG. 3A.

In at least some examples, the structures and/or functions of any of the above-described features can be implemented in software, hardware, firmware, circuitry, or a combination thereof. Note that the structures and constituent elements above, as well as their functionality, may be aggregated with one or more other structures or elements. Alternatively, the elements and their functionality may be subdivided into constituent sub-elements, if any. As software, the above-described techniques may be implemented using various types of programming or formatting languages, frameworks, syntax, applications, protocols, objects, or techniques. As hardware and/or firmware, the above-described techniques may be implemented using various types of programming or integrated circuit design languages, including hardware description languages, such as any register transfer language ("RTL") configured to design field-programmable gate arrays ("FPGAs"), application-specific integrated circuits ("ASICs"), or any other type of integrated circuit. These can be varied and are not limited to the examples or descriptions provided.

Various embodiments or examples of the invention may be implemented in numerous ways, including as a system, a process, an apparatus, or a series of program instructions on a computer readable medium such as a computer readable storage medium or a computer network where the program instructions are sent over optical, electronic, or wireless communication links. In general, operations of disclosed processes may be performed in an arbitrary order, unless otherwise provided in the claims.

A detailed description of one or more examples is provided herein along with accompanying figures. The detailed description is provided in connection with such examples, but is not limited to any particular example. The scope is limited only by the claims, and numerous alternatives, modifications, and equivalents are encompassed. Numerous specific details are set forth in the description in order to provide a thorough understanding. These details are provided as examples and the described techniques may be practiced according to the claims without some or all of the accompanying details. They are not intended to be exhaustive or to limit the invention to the precise forms disclosed, as many alternatives, modifications, equivalents, and variations are possible in view of the above teachings. For clarity, technical material that is known in the technical fields related to the examples has not been described in detail to avoid unnecessarily obscuring the description.

The description, for purposes of explanation, uses specific nomenclature to provide a thorough understanding of the invention. However, it will be apparent that specific details are not required in order to practice the invention. In fact, this description should not be read to limit any feature or aspect of the present invention to any embodiment; rather features and aspects of one example can readily be interchanged with other examples. Notably, not every benefit described herein need be realized by each example of the present invention; rather any specific example may provide one or more of the advantages discussed above. In the claims, elements and/or operations do not imply any particular order of operation, unless explicitly stated in the claims. It is intended that the following claims and their equivalents define the scope of the invention.

What is claimed is:

1. A decoder circuit comprising:
 a predecoder comprising:
  predecode logic configured to receive at least a portion of a memory address and generate one or more predecoded signals corresponding to one or more address bits of the at least the portion of the memory address; and
  a level shifter circuit comprising a negative voltage level shifter, a positive voltage level shifter, and a driver, the level shifter circuit configured to generate a voltage signal on a conductive array line of a plurality of conductive array lines used to access a memory cell in a memory array, wherein the driver to set a value of the voltage signal using at least one of the negative voltage level shifter or the positive voltage level shifter based on the one or more predecoded signals.

2. The decoder circuit of claim 1, wherein each of the one or more predecoded signals indicates a state of a corresponding one of the one or more address bits.

3. The decoder circuit of claim 1, wherein the negative voltage level shifter is configured to shift between a reference value and a negative voltage value, and wherein the positive voltage level shifter is configured to shift between a reference value and a positive voltage value.

4. The decoder circuit of claim 3, wherein responsive to the one or more predecoded signals indicating that the conductive array line is selected for a memory access operation, the decoder is configured to set the value of the voltage signal to at least one of the negative voltage value or the positive voltage value.

5. The decoder circuit of claim 3, wherein responsive to the one or more predecoded signals indicating that the conductive array line is unselected for a memory access operation, the decoder is configured to set the value of the voltage signal to the reference value.

6. The decoder circuit of claim 1, wherein operations of the negative voltage level shifter and the positive voltage level shifter are mutually exclusive.

7. The decoder circuit of claim 1, wherein the driver comprises:
 a first portion to operate during a programming operation of the memory array; and
 a second portion to operate during an erase operation of the memory array.

8. The decoder circuit of claim 1, wherein the memory array comprises a cross-point memory array comprising a plurality of two-terminal, re-writable memory cells, wherein each of the plurality of two-terminal, re-writable memory cells has a first terminal coupled to one of the plurality of conductive array lines.

9. A memory device comprising:
 a cross-point memory array; and
 a decoder circuit coupled to the cross-point memory array, the decoder circuit comprising:
  a predecoder comprising:
   predecode logic configured to receive at least a portion of a memory address and generate one or more predecoded signals corresponding to one or more address bits of the at least the portion of the memory address; and
   a level shifter circuit comprising a negative voltage level shifter, a positive voltage level shifter, and a driver, the level shifter circuit configured to generate a voltage signal on a conductive array line of a plurality of conductive array lines used to access a memory cell in the cross-point memory array, wherein the driver to set a value of the voltage signal using at least one of the negative voltage level shifter or the positive voltage level shifter based on the one or more predecoded signals.

10. The memory device of claim 9, wherein each of the one or more predecoded signals indicates a state of a corresponding one of the one or more address bits.

11. The memory device of claim 9, wherein the negative voltage level shifter is configured to shift between a reference value and a negative voltage value, and wherein the positive voltage level shifter is configured to shift between a reference value and a positive voltage value.

12. The memory device of claim 11, wherein responsive to the one or more predecoded signals indicating that the conductive array line is selected for a memory access operation, the decoder is configured to set the value of the voltage signal to at least one of the negative voltage value or the positive voltage value.

13. The memory device of claim 11, wherein responsive to the one or more predecoded signals indicating that the conductive array line is unselected for a memory access operation, the decoder is configured to set the value of the voltage signal to the reference value.

14. The memory device of claim 9, wherein operations of the negative voltage level shifter and the positive voltage level shifter are mutually exclusive.

15. The memory device of claim 9, wherein the driver comprises:
 a first portion to operate during a programming operation of the cross-point memory array; and
 a second portion to operate during an erase operation of the cross-point memory array.

16. The memory device of claim 9, wherein the cross-point memory array comprises a plurality of two-terminal, re-writable memory cells, wherein each of the plurality of two-terminal, re-writable memory cells has a first terminal coupled to one of the plurality of conductive array lines.

17. An integrated circuit comprising:
 a substrate;
 a cross-point memory array formed above the substrate; and
 a base layer formed on the substrate, the base layer comprising a predecoder, the predecoder comprising:
  predecode logic configured to receive at least a portion of a memory address and generate one or more predecoded signals corresponding to one or more address bits of the at least the portion of the memory address; and
  a level shifter circuit comprising a negative voltage level shifter, a positive voltage level shifter, and a driver, the level shifter circuit configured to generate a voltage signal on a conductive array line of a plurality of conductive array lines used to access a memory cell in the cross-point memory array, wherein the driver to set a value of the voltage signal using at least one of the negative voltage level shifter or the positive voltage level shifter based on the one or more predecoded signals.

18. The integrated circuit of claim 17, wherein each of the one or more predecoded signals indicates a state of a corresponding one of the one or more address bits, and wherein the negative voltage level shifter is configured to shift between a reference value and a negative voltage value, and wherein the positive voltage level shifter is configured to shift between a reference value and a positive voltage value.

19. The integrated circuit of claim 18, wherein responsive to the one or more predecoded signals indicating that the conductive array line is selected for a memory access operation, the decoder is configured to set the value of the voltage signal to at least one of the negative voltage value or the positive voltage value.

20. The integrated circuit of claim 19, wherein responsive to the one or more predecoded signals indicating that the conductive array line is unselected for a memory access operation, the decoder is configured to set the value of the voltage signal to the reference value.

* * * * *